United States Patent
Lin et al.

(10) Patent No.: US 8,921,202 B2
(45) Date of Patent: Dec. 30, 2014

(54) SEMICONDUCTOR DEVICE AND FABRICATION METHOD THEREOF

(75) Inventors: Geeng-Lih Lin, Zhudong Township, Hsinchu County (TW); Kwang-Ming Lin, Hsinchu (TW); Shang-Hui Tu, Tainan (TW); Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 504 days.

(21) Appl. No.: 12/986,225

(22) Filed: Jan. 7, 2011

(65) Prior Publication Data

US 2012/0175727 A1    Jul. 12, 2012

(51) Int. Cl.
  *H01L 21/76* (2006.01)
  *H01L 21/74* (2006.01)
  *H01L 21/8249* (2006.01)
  *H01L 27/06* (2006.01)

(52) U.S. Cl.
  CPC .......... *H01L 21/743* (2013.01); *H01L 21/8249* (2013.01); *H01L 27/0623* (2013.01)
  USPC ..... 438/430; 438/228; 257/520; 257/E21.537

(58) Field of Classification Search
  CPC .............. H01L 29/7802; H01L 29/66712
  USPC .......... 257/272, 256, 520, E21.644, E21.537; 438/361, 228, 223, 430
  See application file for complete search history.

(56) References Cited

U.S. PATENT DOCUMENTS

| | | | |
|---|---|---|---|
| 6,798,037 B2 * | 9/2004 | Leonardi | 257/507 |
| 7,242,070 B2 | 7/2007 | Yang et al. | |
| 7,420,258 B2 * | 9/2008 | Grivna et al. | 257/505 |
| 7,468,307 B2 * | 12/2008 | Hartner et al. | 438/430 |
| 7,902,630 B2 * | 3/2011 | Disney et al. | 257/517 |
| 2006/0076629 A1 * | 4/2006 | Yilmaz | 257/378 |

* cited by examiner

*Primary Examiner* — David Vu

(74) *Attorney, Agent, or Firm* — Birch, Stewart, Kolasch & Birch, LLP

(57) ABSTRACT

The invention provides a semiconductor device. A buried layer is formed in a substrate. A first deep trench contact structure is formed in the substrate. The first deep trench contact structure comprises a conductor and a liner layer formed on a sidewall of the conductor. A bottom surface of the first deep trench contact structure is in contact with the buried layer.

10 Claims, 16 Drawing Sheets

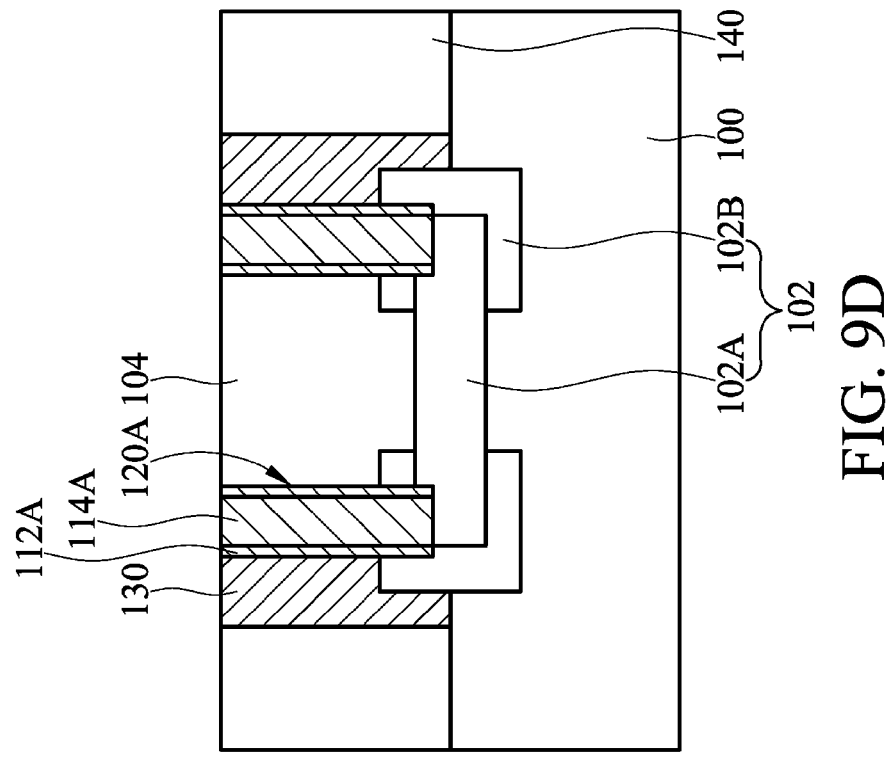
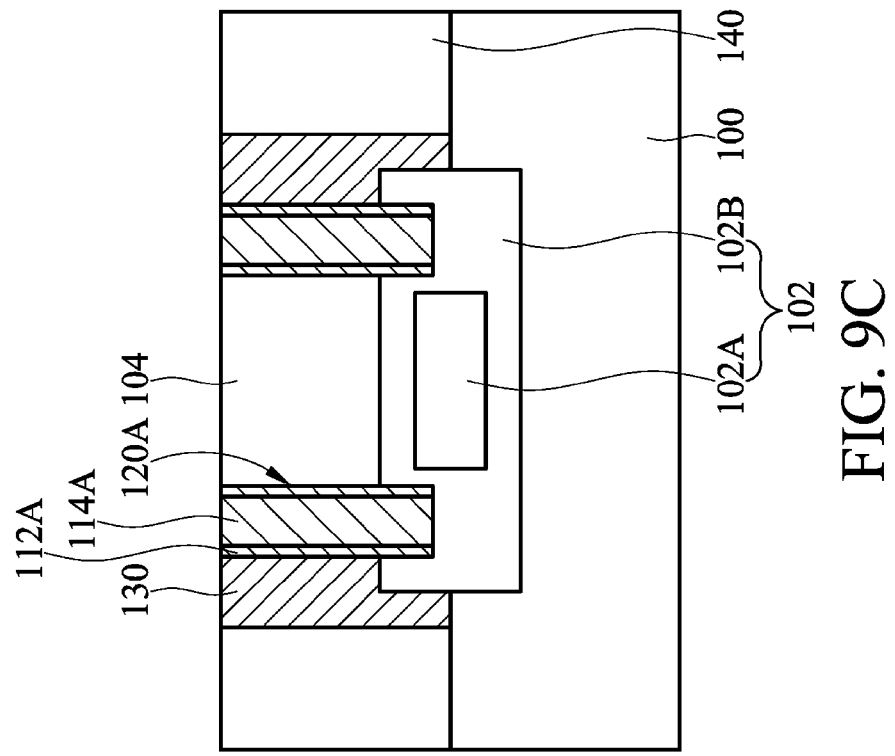

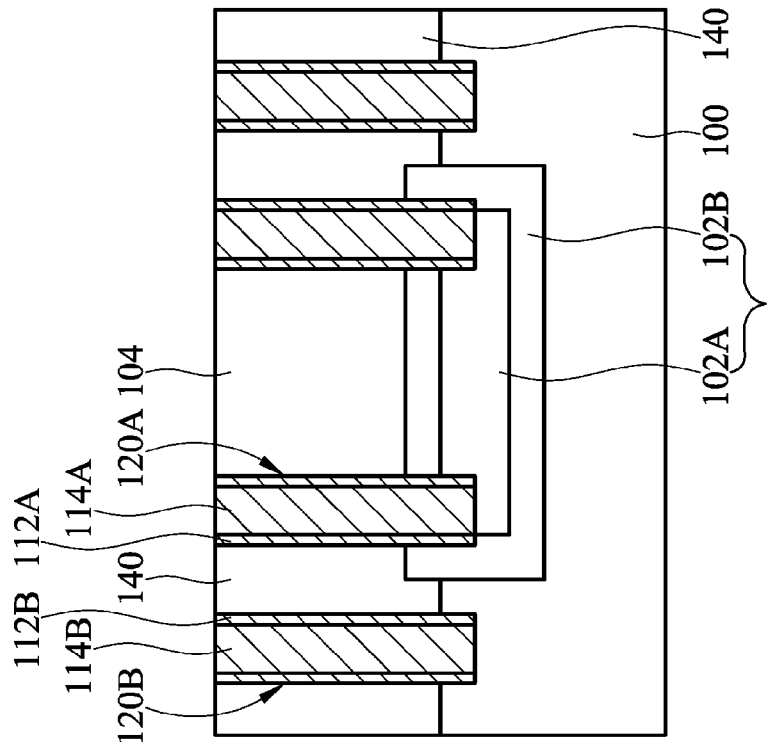
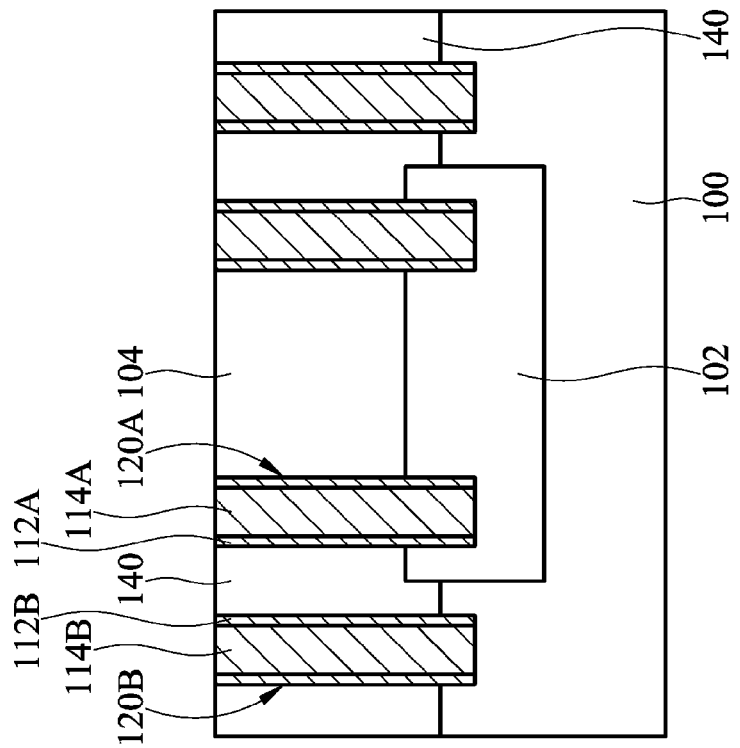
FIG. 10B
FIG. 10A

SEMICONDUCTOR DEVICE AND FABRICATION METHOD THEREOF

BACKGROUND OF THE INVENTION

1. Field of the Invention

The present invention relates to a semiconductor device and fabrication method thereof, and in particular relates to a deep trench contact structure and fabrication method thereof.

2. Description of the Related Art

For present semiconductor techniques, an operating single-chip system has been achieved by integrating controllers, memory devices, low-operation-voltage circuits and high-operation-voltage power devices, into a chip. Research development of power devices, such as vertical double diffused metal oxide semiconductor (VDMOS), insulated gate bipolar transistors (IGBT), lateral double diffused metal oxide semiconductor (LDMOS), or etc., has focused on increasing efficiency to decrease energy loss of the devices. Meanwhile, high voltage transistors and the low voltage CMOS circuits are integrated into a chip, thus isolation structures are formed for isolating adjacent devices.

FIG. 1 shows a cross-section view of a conventional high-voltage device as disclosed in U.S. Pat. No. 7,242,070 B2. An N-type epitaxy layer 40 is formed on a P-type semiconductor substrate 10. P$^+$-type isolation structures 50, defining active regions for high-voltage devices of VDNMOS and bipolar transistor, are formed in the N-type epitaxy layer 40. Field oxide (FOX) layers 18 are formed on the N-type epitaxy layer 40 for isolating device structures in the active region of the high-voltage device. The VDNMOS comprises a P-type body 36 in the N-type epitaxy layer 40, an N-type doped region 32 and P-type doped region 34 in the P-type body 36, and a gate structure 30 on the N-type epitaxy layer 40. The bipolar transistor comprises a P-type body 36' in the N-type epitaxy layer 40, and an N-type doped region 32' and P-type doped region 34' in the P-type body 36'. N$^+$-type trench contacts 60 and 60' are formed in the N-type epitaxy layers 40 in the active regions of the high-voltage devices. The N$^+$-type trench contacts 60 and 60' pass through the N-type epitaxy layers 40, and are partially embedded in N-type buried layers 2 and 2' between the N-type epitaxy layer 40 and P-type semiconductor substrate 10. The N$^+$-type trench contacts 60 and 60' are electrically connected to contact plugs 19 in an inter-layer dielectric layer 16 and metal layers 21 on the contact plugs 19.

The N$^+$-type trench contacts 60 and 60' are usually formed by doping an N-type dopant with a high dosage and a high energy and annealing with a high thermal budget. The N$^+$-type trench contacts 60 and 60' of high-concentration dopant would be easily polluted by an out gassing generated in the annealing process and contaminants in the process environment, resulting in low device efficiency. For obtaining a proper breakdown voltage and adapting in process feasibility, the N$^+$-type trench contacts 60 and 60' have to be far away from the P$^+$-type isolation structures 50. However, the number of the devices can be constructed in a single wafer is thus limited.

FIG. 2 is a cross-section view of one other conventional high-voltage device. A deep trench isolation structure 70 formed with a dielectric material replaces the P+-type isolation structure 50 of FIG. 1. The deep trench isolation structure 70 can be used for improving the area of the active region of the high-voltage device. However, the deep trench isolation structure 70 must be much deeper than N-type epitaxy layers 40 so as to prevent noise caused from the high-voltage condition. It is not easy to fabricate the deep trench isolation structure 70 to high degree of depth. In addition, controlling the aspect ratio of the deep trench isolation structure 70 is also a challenge. Therefore, the improvement for the operating voltage of the high-voltage device is limited.

An improved semiconductor device and fabrication method thereof ameliorating the disadvantages of the conventional technology is desirable.

BRIEF SUMMARY OF INVENTION

A detailed description is given in the following embodiments with reference to the accompanying drawings.

The invention provides a semiconductor device. A buried layer is formed in a substrate. A first deep trench contact structure is formed in the substrate. The first deep trench contact structure comprises a conductor and a liner layer formed on a sidewall of the conductor. A bottom surface of the first deep trench contact structure is in contact with the buried layer.

The invention also provides a fabrication method of a semiconductor device. A substrate having a buried layer therein is provided. A first deep trench contact structure is formed in the substrate. The first deep trench contact structure comprises a conductor and a liner layer on a sidewall of the conductor. A bottom surface of the first deep trench contact structure is in contact with the buried layer.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
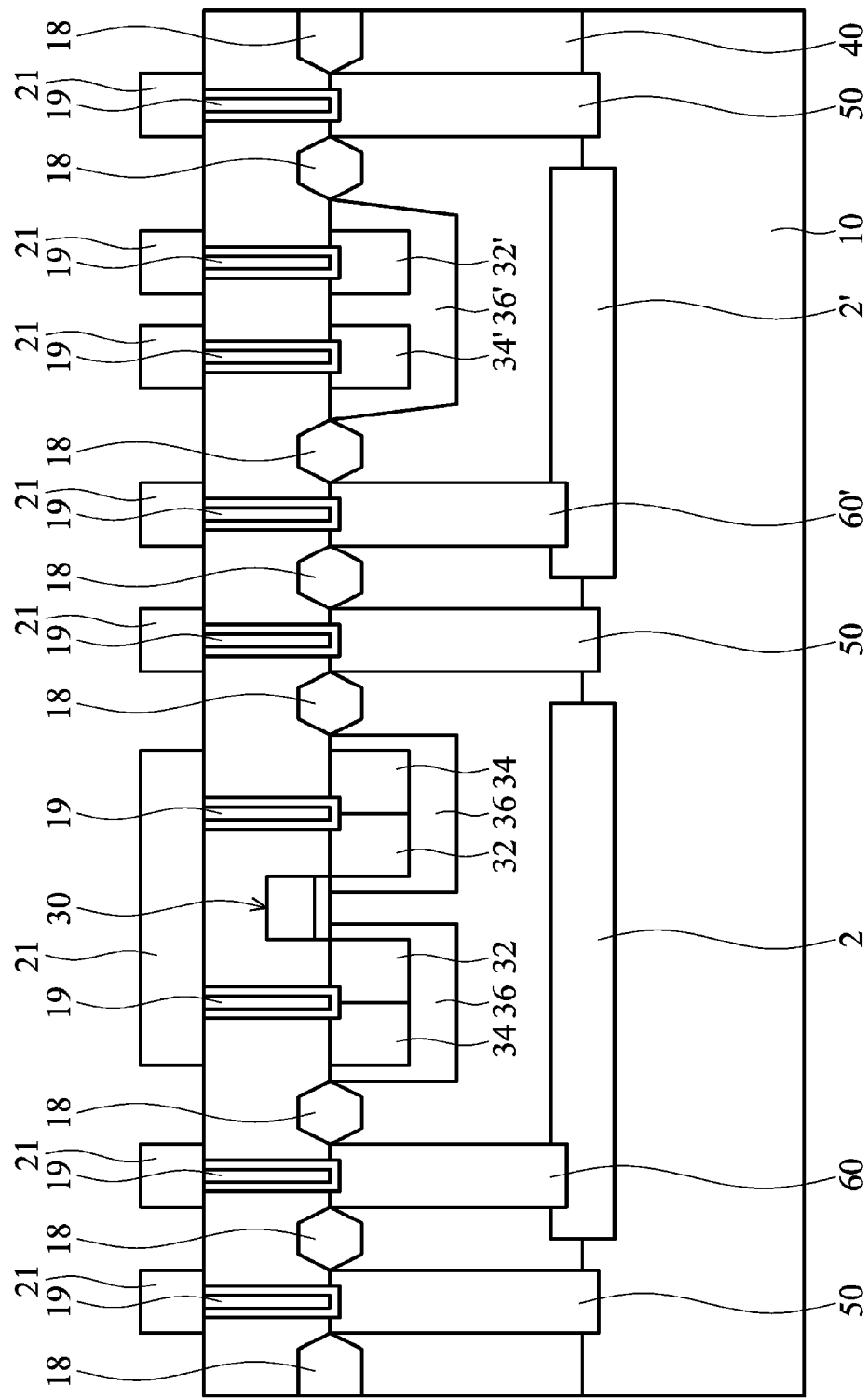
FIGS. 1 to 2 show cross-section views of conventional high-voltage devices.
Figure 2:
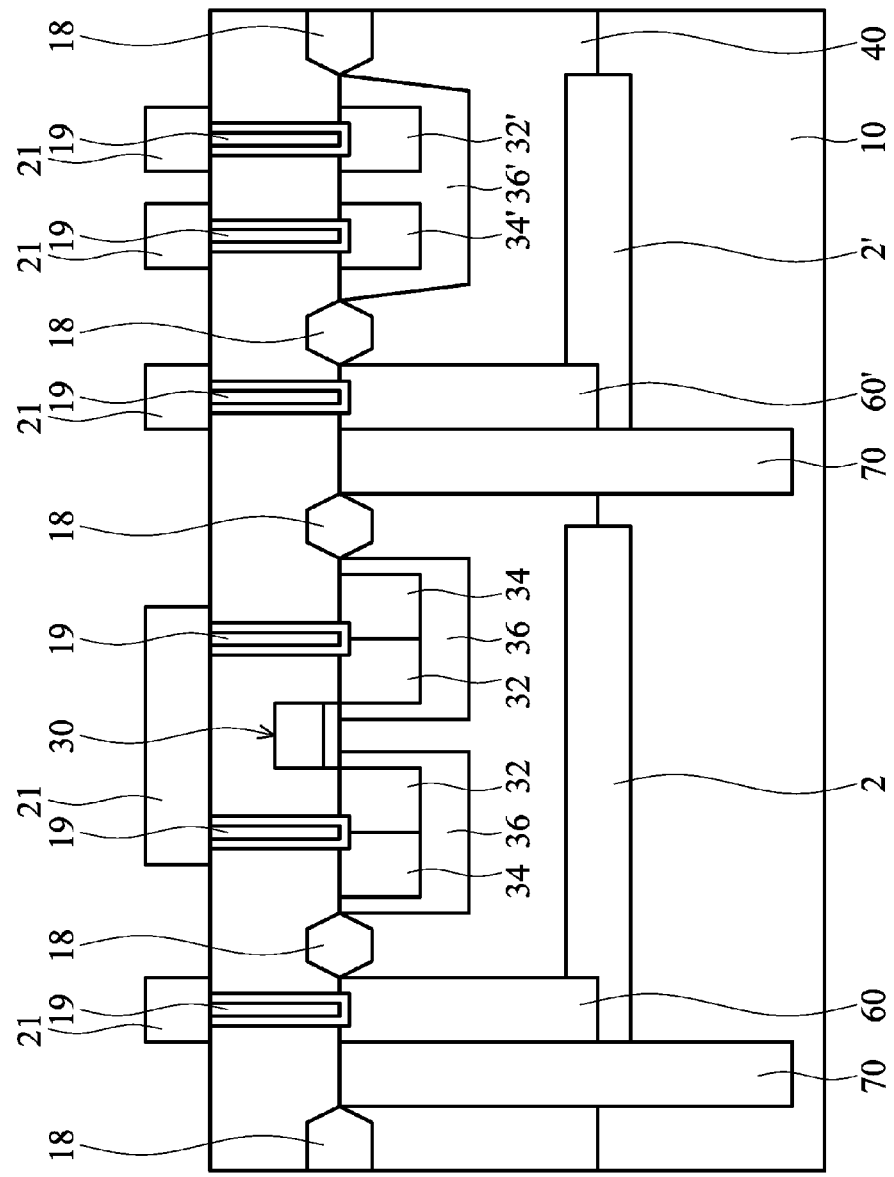

Embodiments of the present invention provide a semiconductor device and fabrication method thereof. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIGS. 3 to 6 are cross-section views illustrating the method for forming the semiconductor device accordingly to one embodiment of the present invention. The present invention is described as a high-voltage device of VDNMO and bipolar transistor, but not limited thereto.

Figure 3:
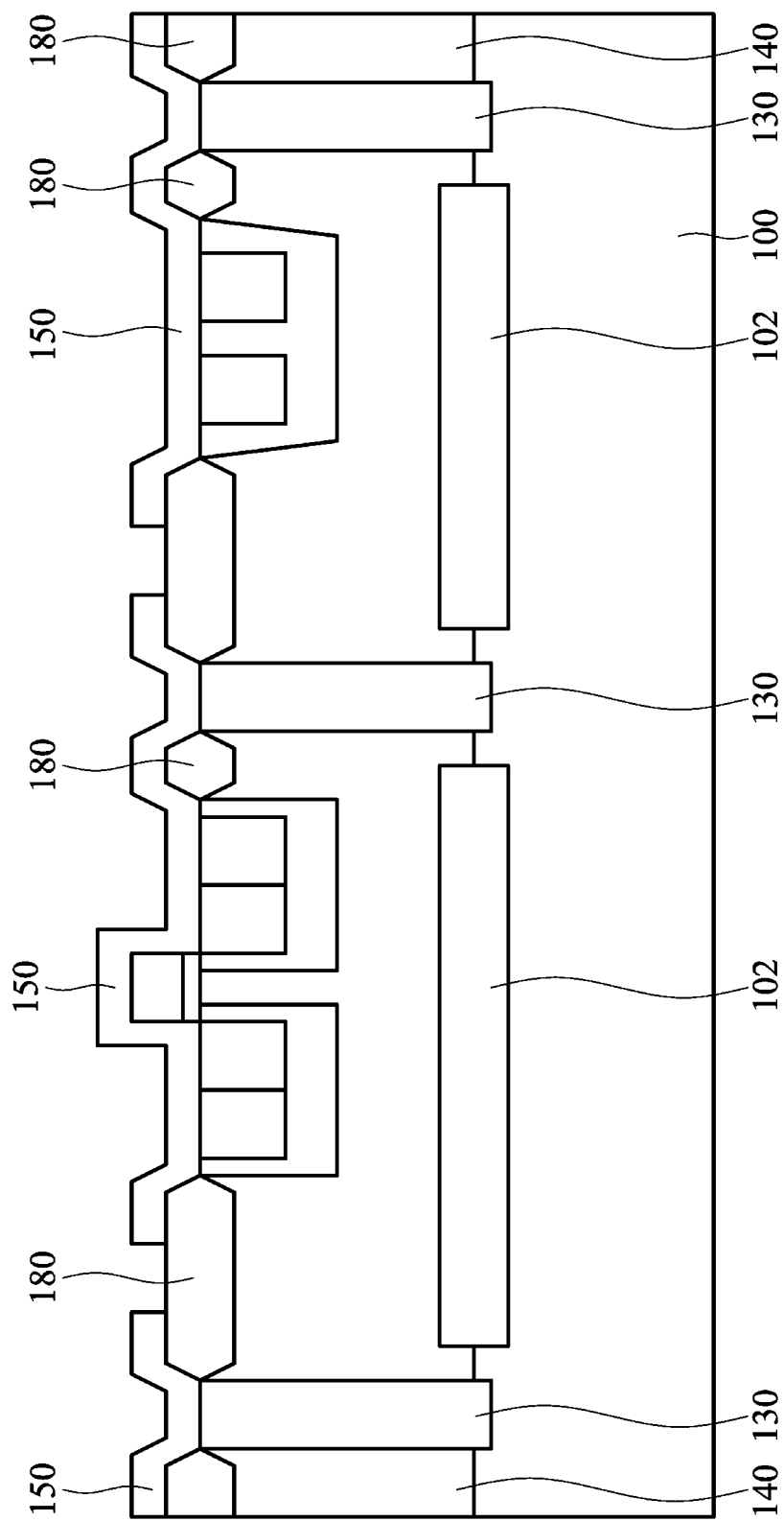
FIGS. 3 to 6 are cross-section views illustrating a method for forming a semiconductor device according to one embodiment of the present invention.

Referring to FIG. 3, an epitaxy layer 140 is formed on a substrate 100. A buried layer 102 is disposed between the substrate 100 and epitaxy layer 140. An isolation structure 130 is disposed in the epitaxy layer 140 outside of the buried layer 102. The substrate 100 may comprise silicon or other suitable semiconductor materials. The substrate 100, epitaxy layer 140 and buried layer 102 may have different types of conductivity. In one embodiment, the substrate 100 and isolation structure 130 may have P-type conductivity, and the epitaxy layer 140 and buried layer 102 may have N-type conductivity. Referring to FIG. 3, a mask layer 150 covering the epitaxy layer 140 is patterned to expose the surface of a region, such as the surface of a field oxide layer 180 above the epitaxy layer 140, expected to remove.

Figure 4:
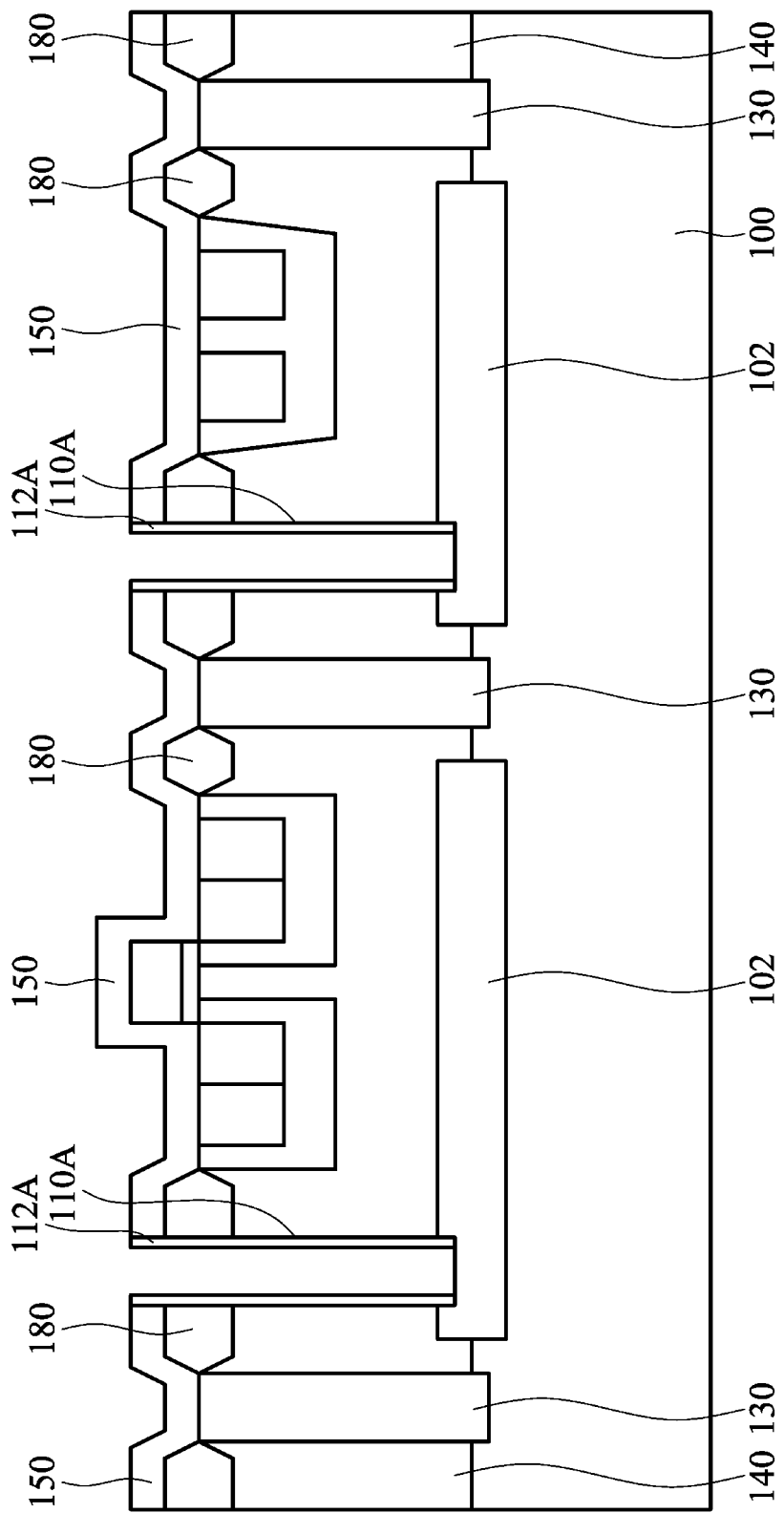

Referring to FIG. 4, a deep trench 110A exposing the buried layer 102 may be formed by removing the field oxide layer 180 exposed by the patterned mask layer 150 and the epitaxy layer 140 and a partial depth of the buried layer 102 under the field oxide layer 180. In other embodiments, the deep trench 110A exposing the top surface of the buried layer 102 (not shown) may be formed by removing the field oxide layer 180 exposed by the patterned mask layer 150 and the epitaxy layer 140 under the field oxide layer 180. Next, a liner layer 112A is formed on the bottom and sidewall of the deep trench 110A. Next, the liner layer 112A on the bottom of the deep trench 110A is removed by an etching process, and the liner layer 112A on the sidewall of the deep trench 110A remains. The liner layer 112A may comprise an oxide such as TEOS.

Figure 5:
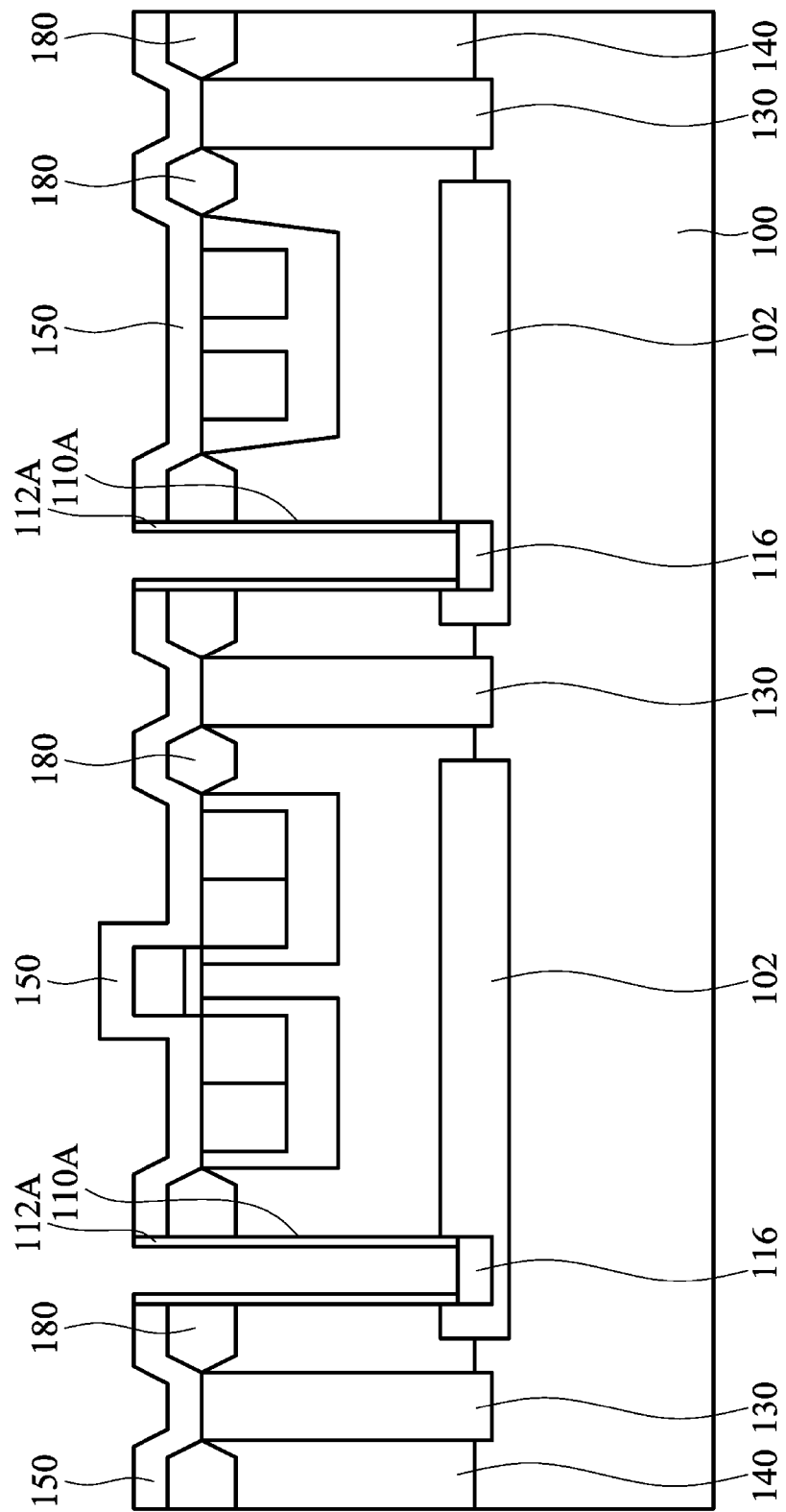

Referring to FIG. 5, after forming the liner layer 112A, a doped region 116 may be formed in the buried layer 102 exposed by the deep trench 110A by a doping process. The doped region 116 may have a type of conductivity which is the same as the buried layer 102. In one embodiment, the doped region 116 and buried layer 102 both have N-type conductivity. After the doping process, the doped region 116 may be annealed so as to diffuse into an outer or deeper region, for example, a region under the liner layer 112A as shown in FIG. 5. In other embodiments, the doped region may be not formed in the buried layer 102. The doped region 116 can provide good dopant uniformity. A dopant concentration of the doped region 116 may be higher than that of the buried layer 102 for obtaining a resistor/capacitor having a good interface and a stable conductor element.

Figure 6:
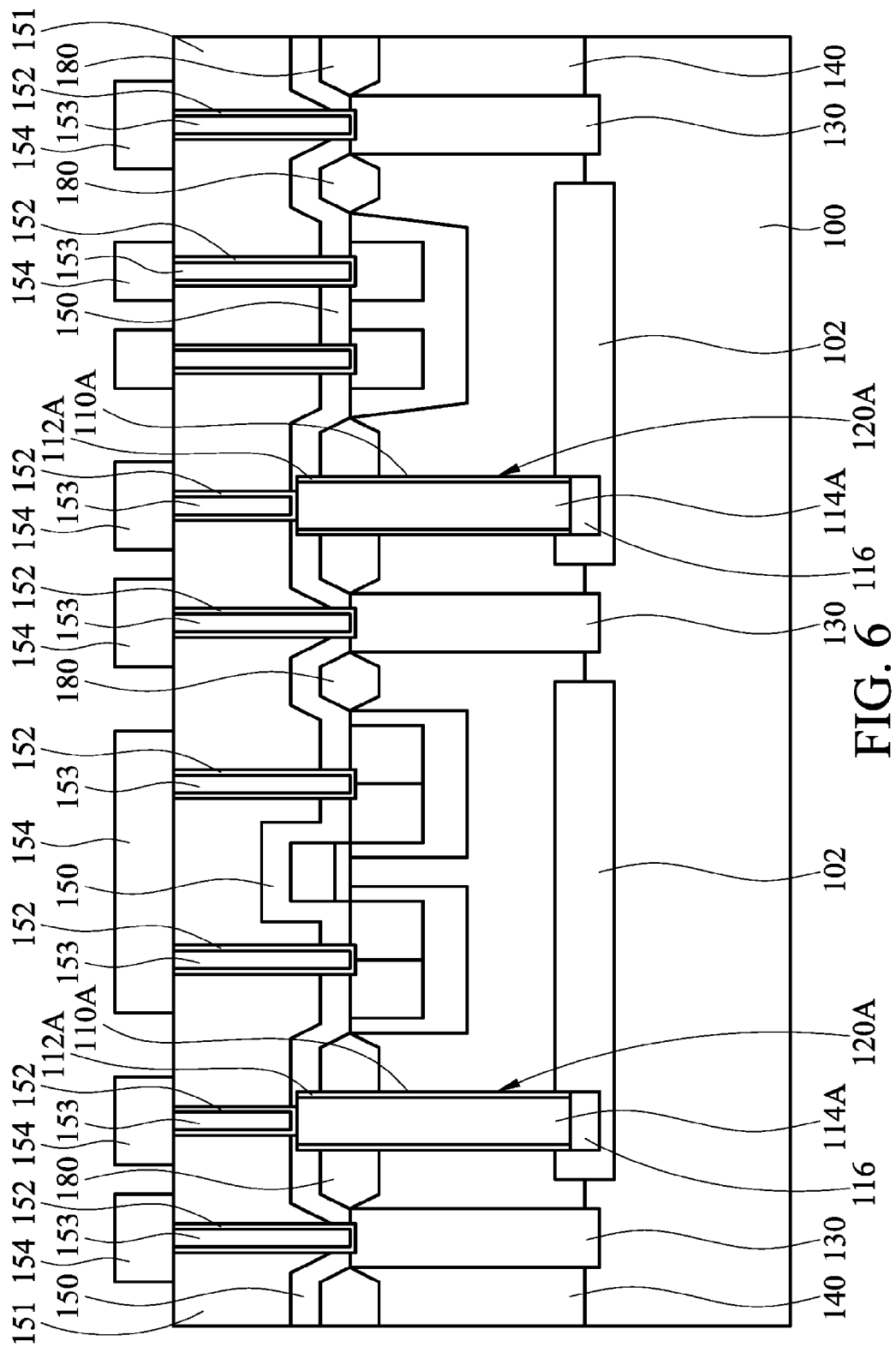

Referring to FIG. 6, the deep trench 110A is filled with a conductor 114A so as to form a deep trench conductor structure 120A. In one embodiment, a portion of the conductor 114A higher than the deep trench 110A may be removed by an etching back process. The conductor 114A may comprise a conductive material such as doped polysilicon. In the preferred embodiment, the conductor 114A is a doped polysilicon formed by an in-situ chemical vapor deposition process in an environment having dopant vapors. The conductor 114A, doped region 116 and buried layer 102 may have the same type of conductivity. In one embodiment, the conductor 114A, doped region 116 and buried layer 102 all have N-type conductivity. In the preferred embodiment, the conductor 114A is an N-doped polysilicon. In other embodiments, the conductor 114A may comprise a metal such as tungsten or aluminum et al.

After forming the deep trench contact structure 120A, an inter-layer dielectric layer 151 and contact plug 153, passing through the inter-layer dielectric layer 151 and electrically connected to the deep trench contact structure 120A and high-voltage device, are formed on the inter-layer dielectric layer 151. A width of the contact plug 153 may be smaller or bigger than, or equal to that of the isolation structure 130 or deep trench contact structure 120A. In one embodiment, a barrier layer 152, such as titanium or titanium nitride, may be formed on the sidewall and bottom of the contact plug 153, and a metal layer 154 may be formed on the contact plug 153.

The buried layer 102, doped region 116 and deep trench contact structure 120A can be electrically connected to an exterior through the contact plug 153 and metal layer 154. The deep trench contact structure 120A can transfer the parasitic charge generated near the buried layer 102 due to the high-voltage so as to prevent the noise signal. The voltage of the buried layer 102 can be controlled by the exterior via the deep trench contact structure 120A.

With increasing crystal lattice differences of the oxide of the liner layer 112A and the epitaxial layer 140, a stress occurs easily in an interface between the liner layer 112A and the epitaxial layer 140. A structural defect may be formed due to increasing crystal lattice differences following a high temperature process. By choosing a doped polysilicon as the conductor 114A, the stress between the materials may be buffered, thus improving the stability and the efficiency of devices.

Since the conductor 114A of deep trench contact structure 120A is formed by an in-situ chemical vapor deposition process in an environment having dopant vapors, an additional doping process that would cause the pollution problem due to the diffused impurity is not necessary. The device efficiency is thus improved. In addition, the deep trench contact structure 120A can be disposed closer to the main device. Since the insulating oxide of the liner layer 112 is formed on the sidewall of the deep trench contact structure 120A, the deep trench contact structure 120A can be used as an isolation structure for isolating devices. In one embodiment, the active region is defined by the deep trench contact structure 120A. Moreover, the deep trench contact structure 120A may also not extend over the buried layer 102. The excellent isolating effect from the deep trench contact structure 120A can increase the operating voltage of the device. The area for forming a single device can be decreased. Therefore, the number or density of devices that can be fabricated in a single wafer is thus increased.

FIGS. 7 to 11 are cross-section views of variation embodiments of FIGS. 3 to 6. Some elements described in FIGS. 3 to 6 are not shown in FIGS. 7 to 11 for clarity and convenience. Referring to FIGS. 7A to 7D, the buried layer 102 and deep trench contact structure 120A are formed in the substrate 100. The deep trench contact structure 120A has the conductor 114A and the liner layer 112A formed on the sidewall of the conductor 114A. The bottom and a part of the sidewall may be contacted with the buried layer 102. In other embodiments, a doped region (not shown) may be formed in the buried layer 102 under the deep trench contact structure 120A.

Figure 7B:
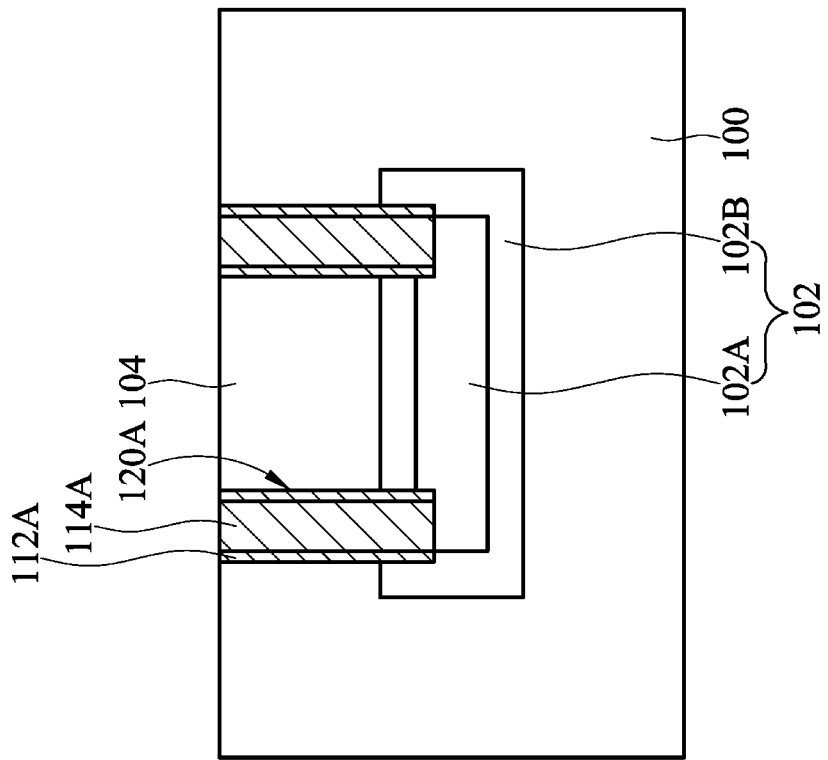
FIGS. 7 to 11 are cross-section views of semiconductor devices according to embodiments of the present invention.
Figure 7A:
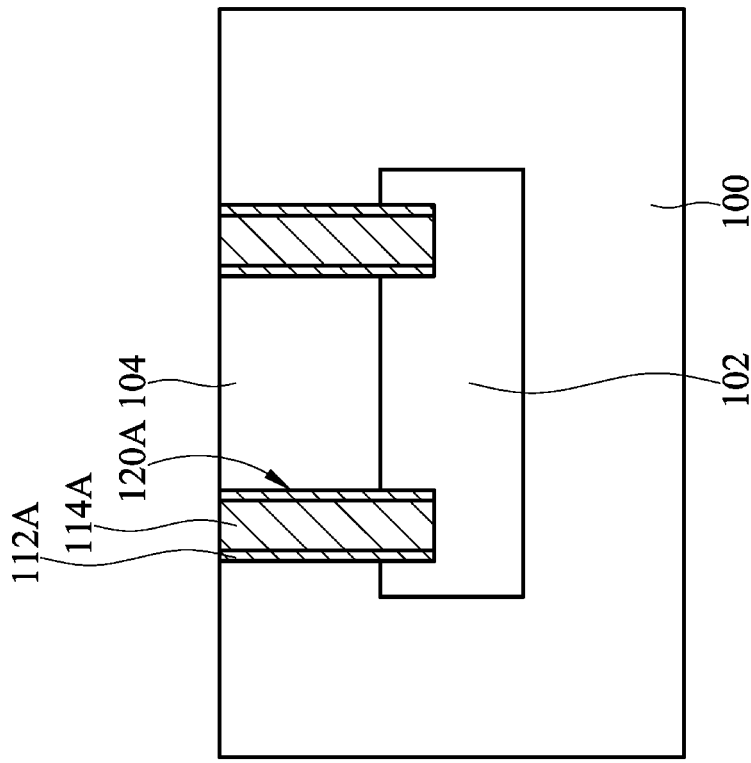
Figure 7D:
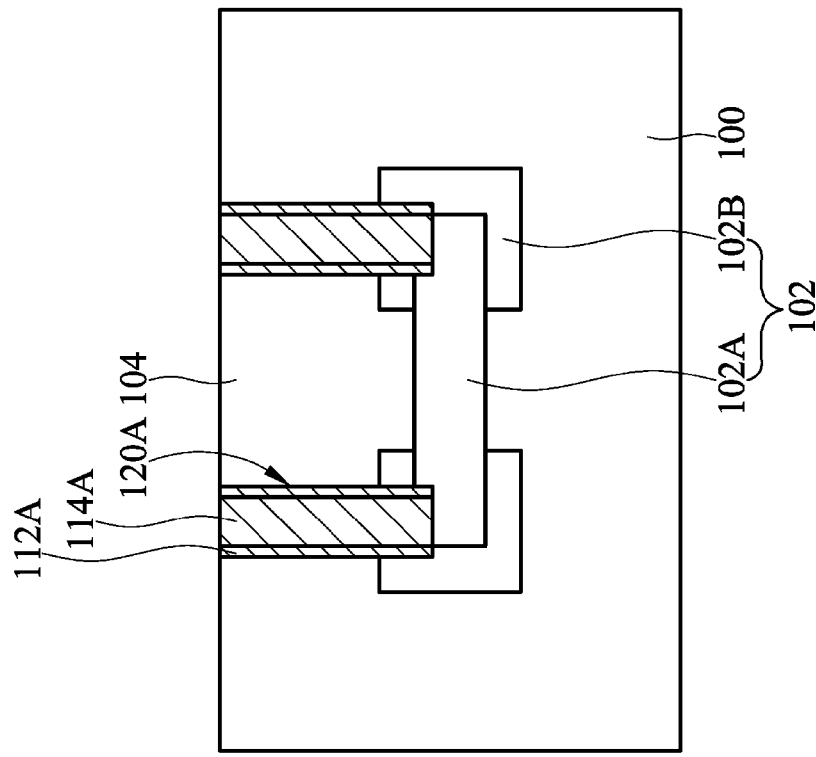
Figure 7C:
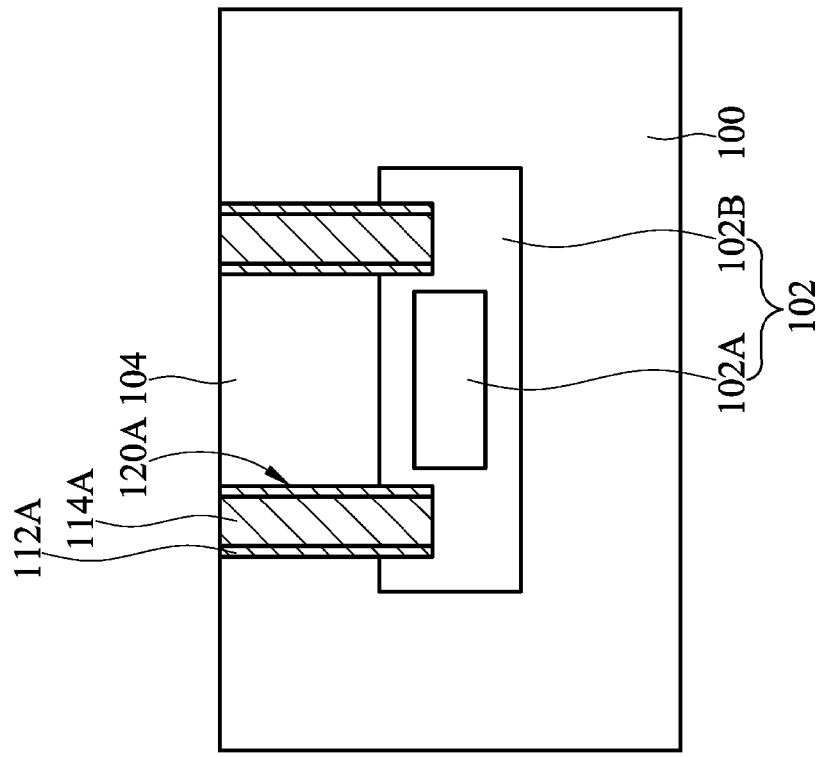
Figure 8B:
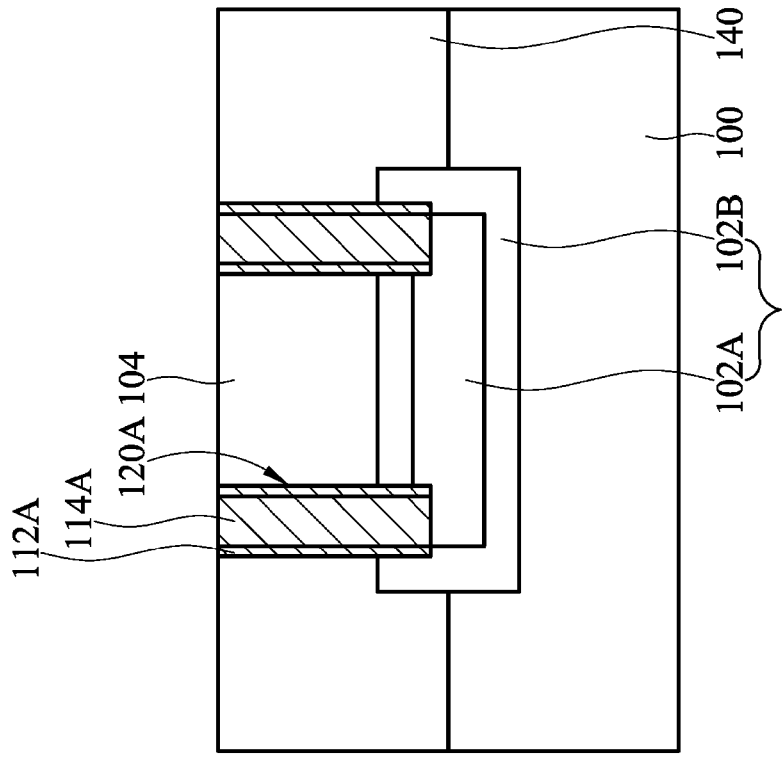
Figure 8A:
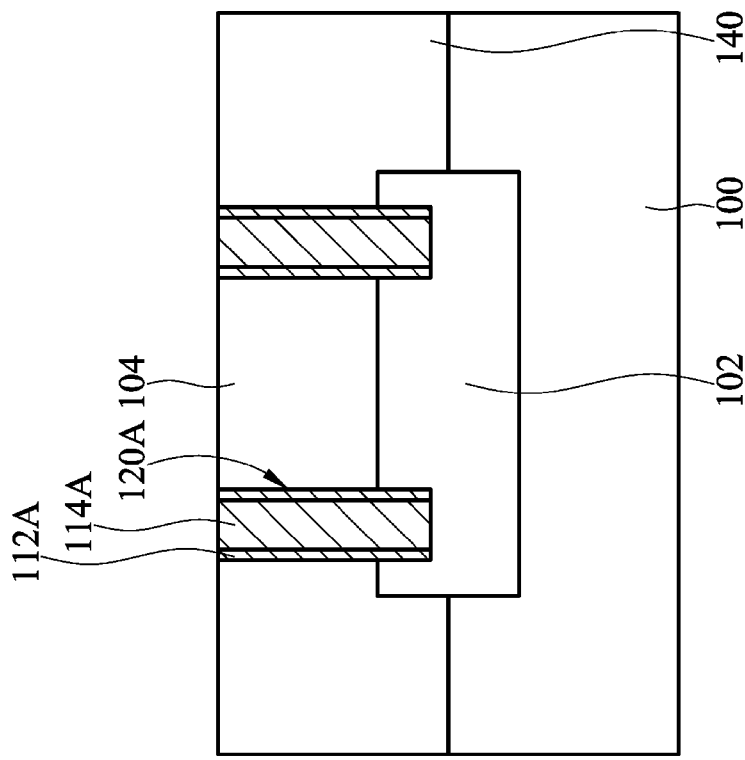
Figure 8D:
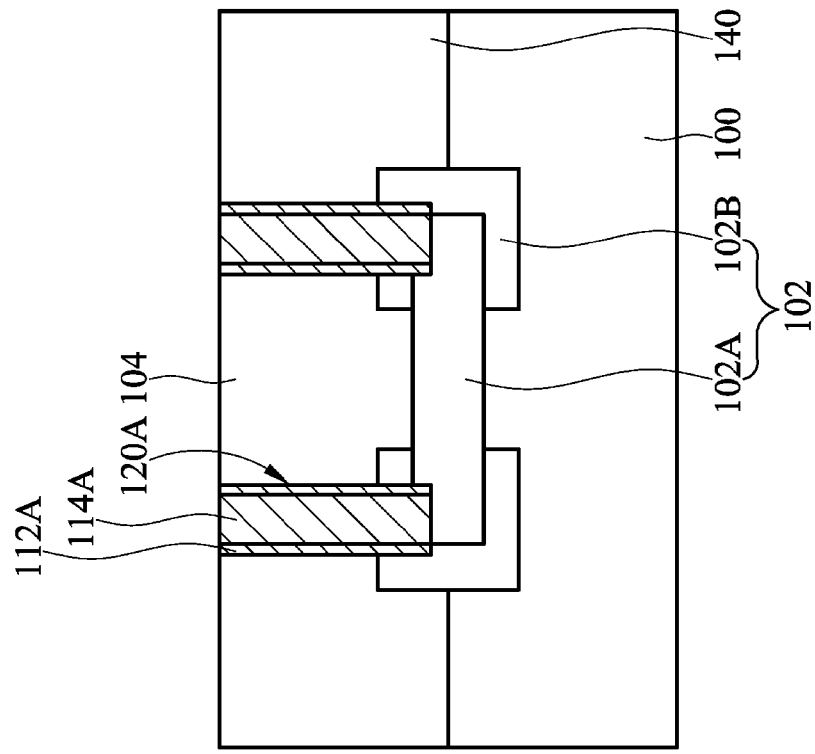
Figure 8C:
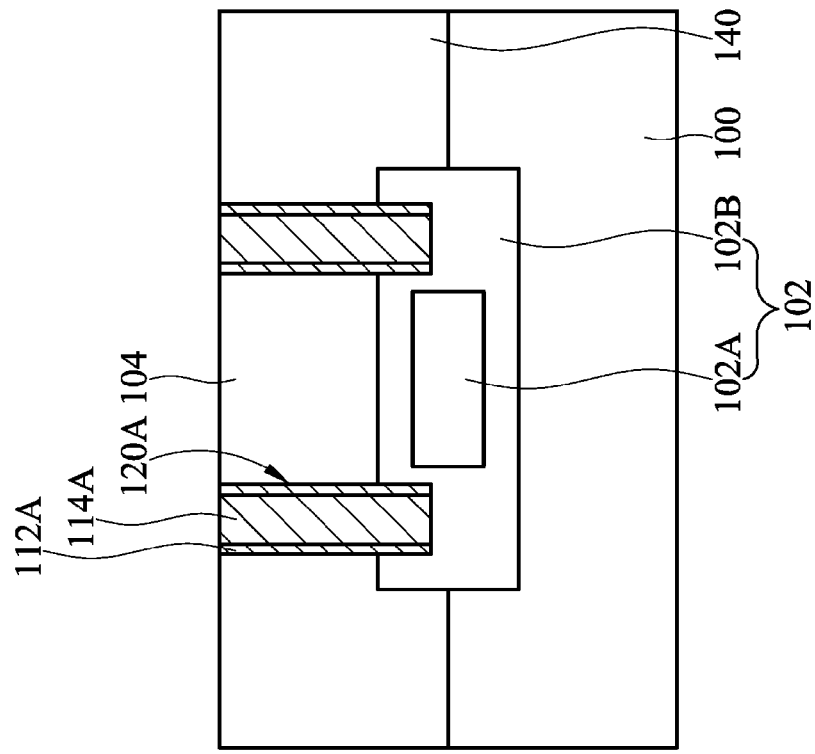
Figure 9B:
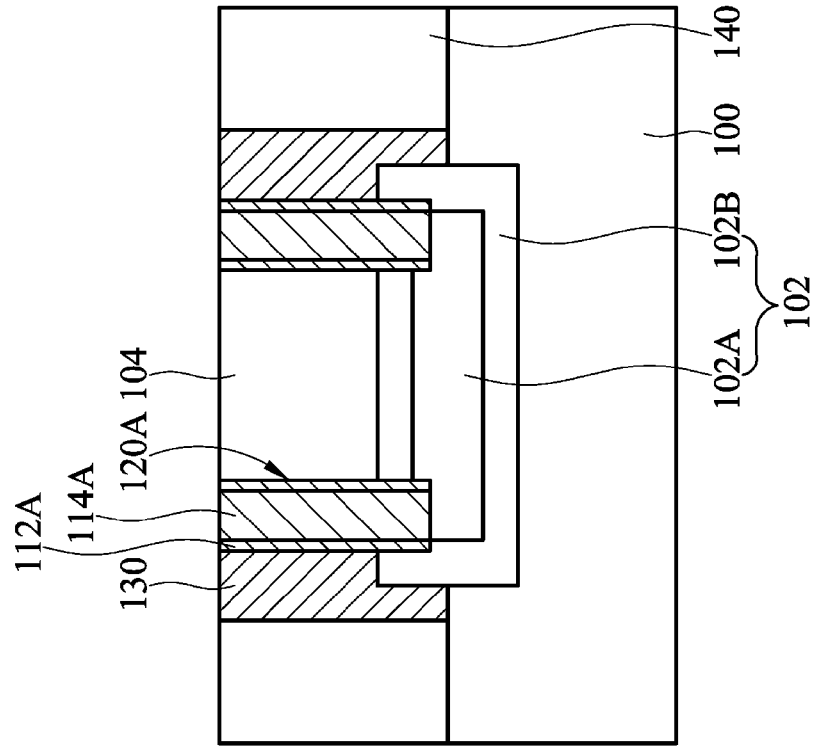
Figure 9A:
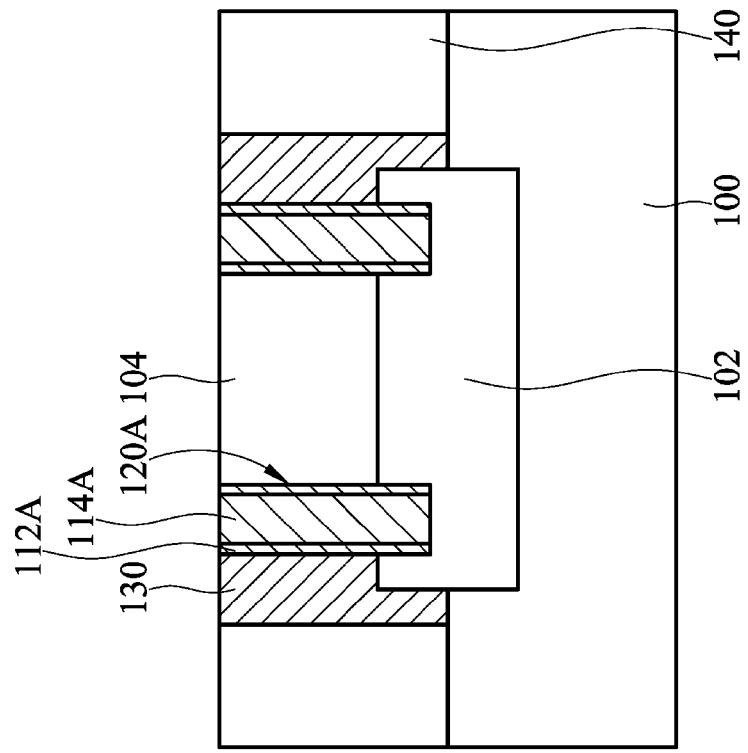
Figure 10C:
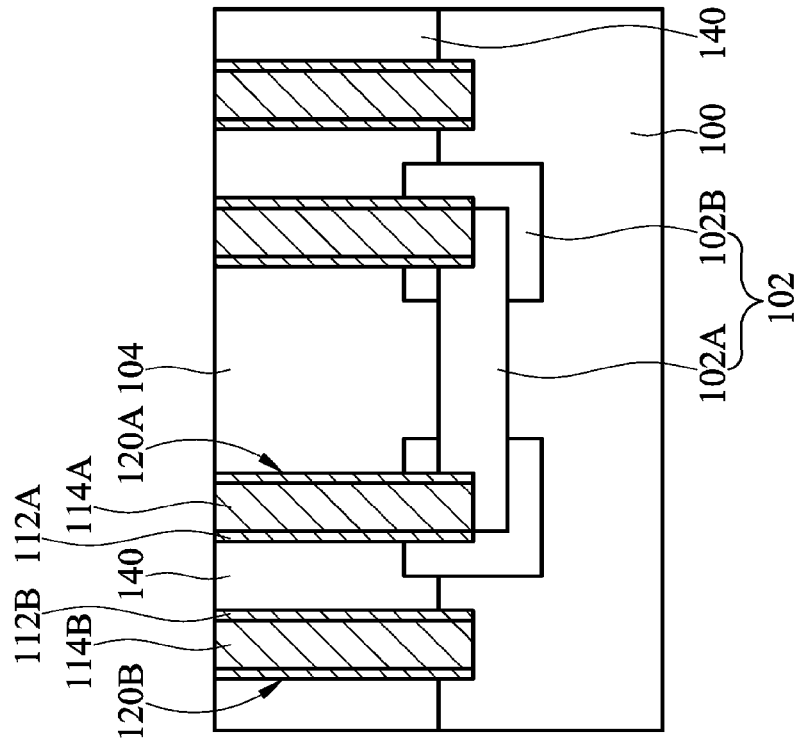
Figure 10D:
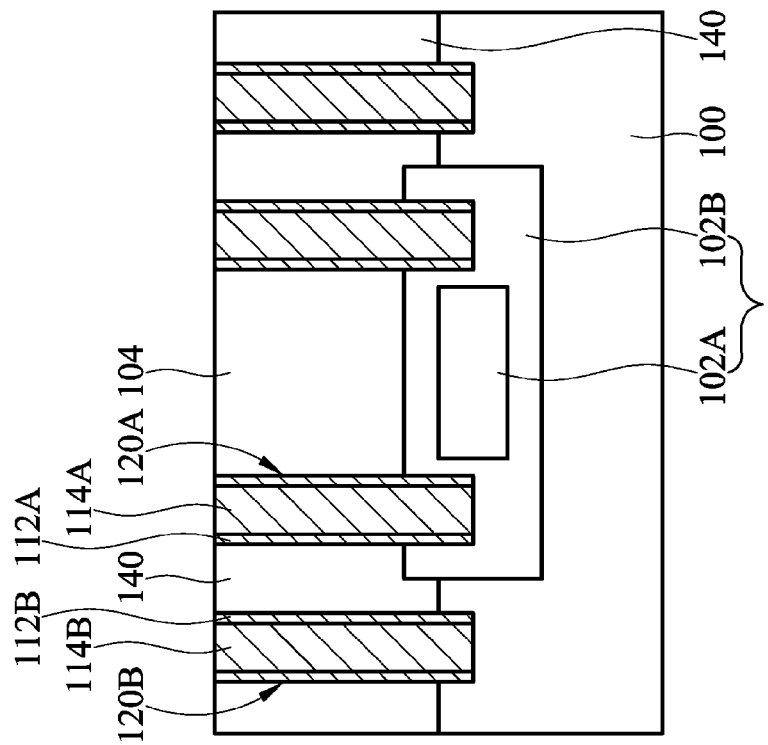
Figure 11B:
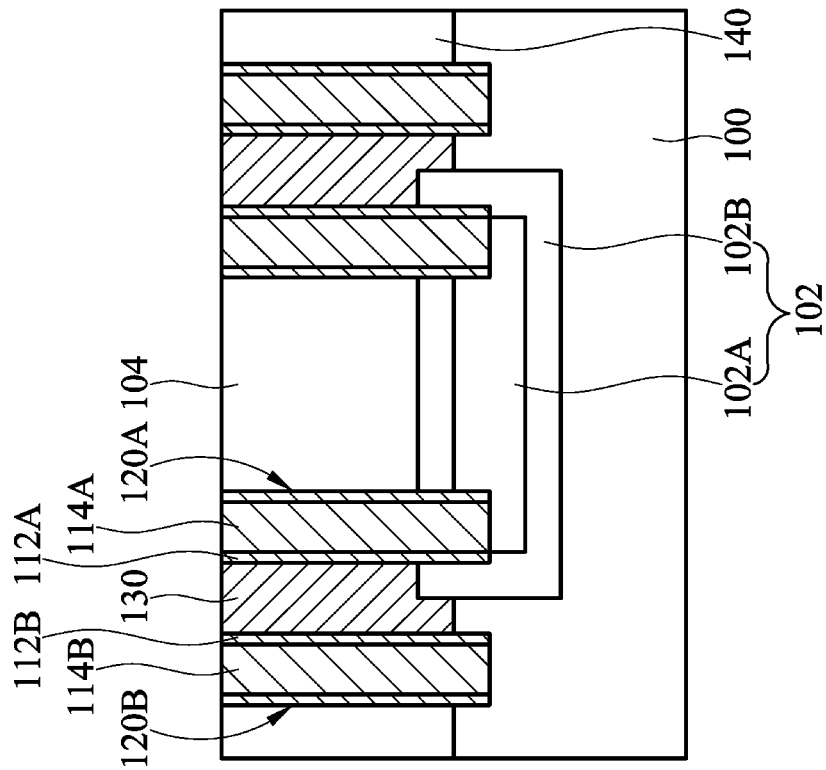
Figure 11A:
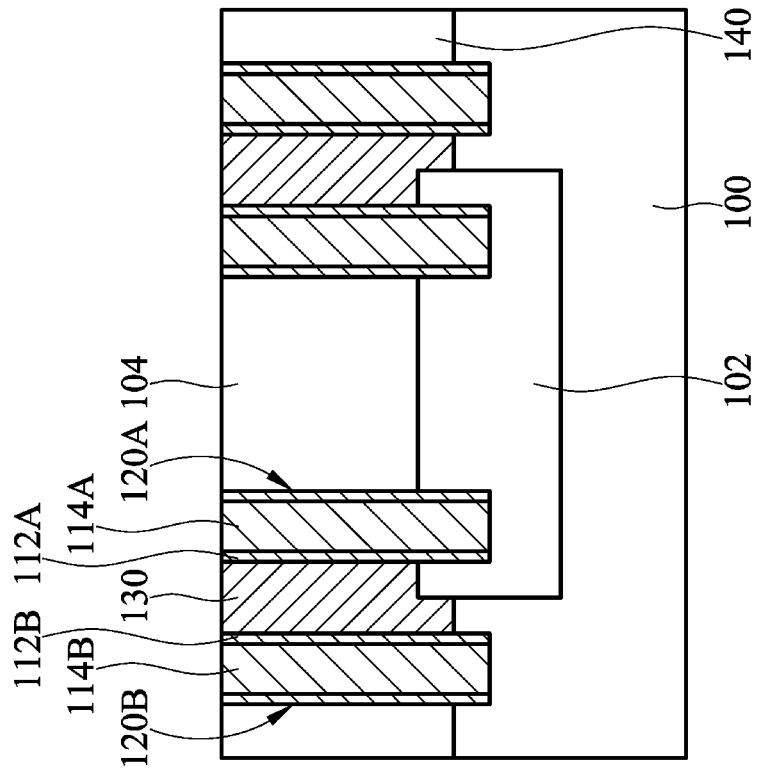
Figure 11D:
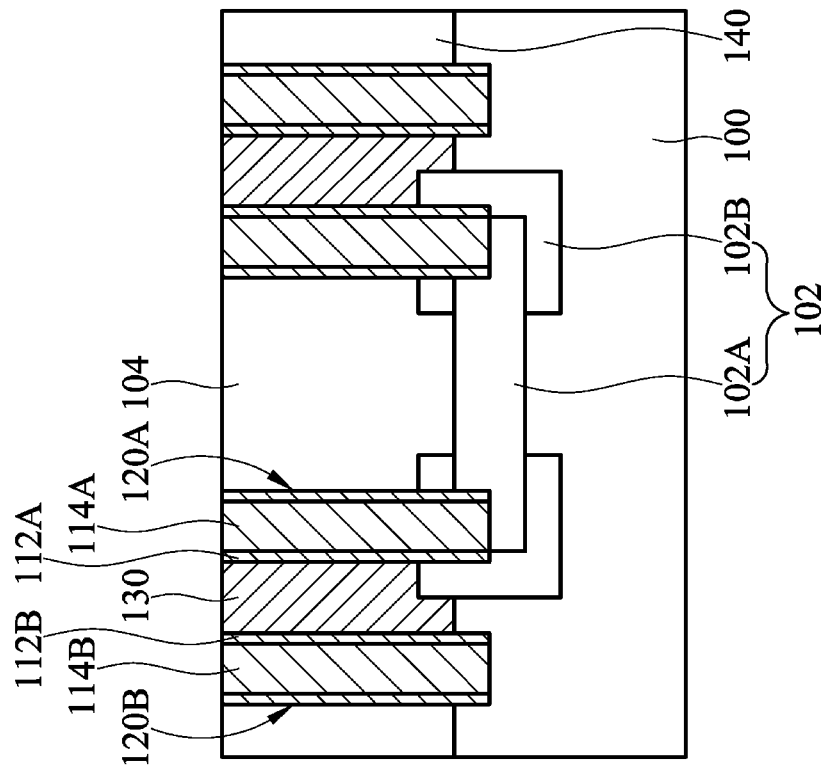
Figure 11C:
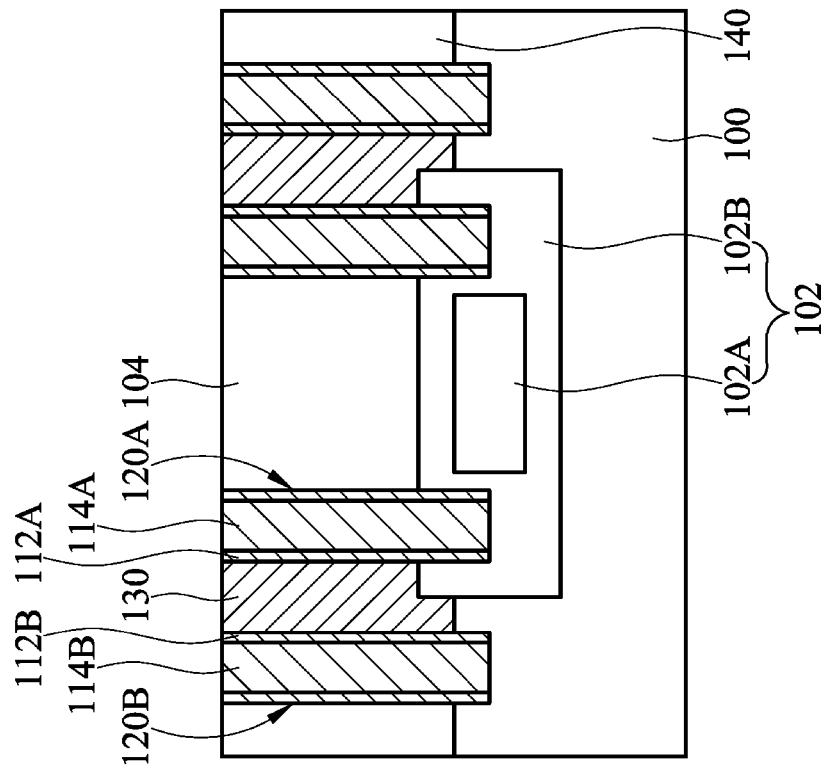

The buried layer 102 may have a uniform dopant concentration as shown in FIG. 7A. The buried layer 102 may be formed with a first buried region 102A having a higher dopant concentration and a second buried region 102B having a lower dopant concentration as shown in FIGS. 7B to 7D. The first buried region 102A may be wholly embedded in the second buried region 102B as shown in FIGS. 7B to 7C. The first buried region 102A may be partially embedded in the second buried region 102B as shown in FIG. 7D. Comparing to the second buried region 102B, the first buried region 102A of higher dopant concentration has a lower resistance. The first buried region 102A thus has a higher conductivity. In addition, the second buried region 102B outside of the first buried region 102A has a lower dopant concentration, i.e. higher resistance, and can improve the operating voltage while maintaining perfect conductivity of the first buried region 102A.

In the embodiments as shown in FIGS. 7A to 7D, the well region 104 may be defined by the deep trench contact structure 120A and buried layer 102. In other embodiments, other elements such as high-voltage elements (not shown) are formed in the well region 104. In the preferred embodiment, the substrate may have P-type conductivity, and the buried layer 102 and well region 104 may have N-type conductivity.

FIGS. 8A to 8D are cross-section views of variation embodiments of FIGS. 7A to 7D. The similar parts are not repeatedly described. Referring to FIGS. 8A to 8D, the epitaxy layer 140 may be formed on the substrate 100. The buried layer 102 may be formed between the substrate 100 and epitaxy layer 140. The deep trench contact structure 120A may be formed in the epitaxy layer 140, and the bottom and a part of the sidewall of the deep trench contact structure 120A may be in contact with the buried layer 102. The well region 104 may be defined in the epitaxy layer 140 by the deep trench contact structure 120A and buried layer 102. In one embodiment, a doped region (not shown) may be formed in the buried layer 102 under the deep trench contact structure 120A. In one embodiment, the substrate 100 and well region may have P-type conductivity, and the buried layer 102 may have N-type conductivity. In other embodiments, the substrate may have P-type conductivity, and the buried layer 102 and well region 104 may have N-type conductivity. In one embodiment, a device such as pseudo-VDMOS may be formed in the well region 104.

FIGS. 9A to 9D are cross-section views of variation embodiments of FIGS. 8A to 8D. The similar parts are not repeatedly described. Referring to FIGS. 9A to 9D, the isolation structure 130 may be formed on the substrate 100 outside of the buried layer 102 and deep trench contact structure 120A. In one embodiment, a doped region (not shown) may be formed in the buried layer 102 under the deep trench contact structure 120A. In one embodiment, the isolation structure 130 and substrate 100 may have the same type of conductivity (but not limited thereto). The isolation structure 130 and the buried layer 102 may have different types of conductivity (but not limited thereto). In one embodiment, the substrate 100, well region 104 and isolation structure 130 may have P-type conductivity, and the buried layer 102 may have N-type conductivity.

FIGS. 10A to 10D are cross-section views of variation embodiments of FIGS. 8A to 8D. The similar parts are not repeatedly described. Referring to FIGS. 10A to 10D, the deep trench contact structure 120B may be formed in the epitaxy layer 140 outside of the buried layer 102 and deep trench contact structure 120A. The deep trench contact structure 120B is not deeper than the epitaxy layer 140. In one embodiment, a doped region (not shown) may be formed in the buried layer 102 under the deep trench contact structure 120A, or in the substrate 100 under the deep trench contact structure 120B. The depth of the deep trench contact structure 120B may be bigger or smaller than, or equal to that of the deep trench contact structure 120A. In one embodiment, the deep trench contact structure 120B may be replaced by the deep trench isolation structure deeper than the deep trench contact structure 120A (not shown). The deep trench contact structure 120B is not described in detail since it is similar to the deep trench contact structure 120A. The conductor 114B of the deep trench contact structure 120B may be the same as the conductor 114A of the deep trench contact structure 120A (but not limited thereto). The liner layer 112B of the deep trench contact structure 120B may be same as the liner layer 112A of the deep trench contact structure 120A (but not limited thereto). In one embodiment, the substrate 100 may have P-type conductivity, and the buried layer 102 and well region 104 may have N-type conductivity.

FIGS. 11A to 11D are cross-section views of variations of embodiments from FIGS. 10A to 10D. The similar parts are not repeatedly described. Referring to FIGS. 11A to 11D, the isolation structure 130 may be formed in the epitaxy layer 140 between the deep trench contact structure 120A and deep trench contact structure 120B. In one embodiment, a doped region (not shown) may be formed in the buried layer 102 under the deep trench contact structure 120A, or in the substrate 100 under the deep trench contact structure 120B. The depth of the deep trench contact structure 120B may be bigger or smaller than, or equal to that of the deep trench contact structure 120A. In one embodiment, the deep trench contact structure 120B may be replaced by the deep trench isolation structure (not shown) deeper than the deep trench contact structure 120A. In one embodiment, the substrate 100 and isolation structure 130 may have P-type conductivity, and the buried layer 102 and well region 104 may have N-type conductivity.

In embodiments of the present invention, the deep trench contact structure is formed in the substrate having the buried layer formed therein. The deep trench contact structure comprises the conductor and the liner layer formed on the sidewall of the conductor. Since the conductor of deep trench contact structure is formed by an in-situ chemical vapor deposition process in an environment having dopant vapors, an additional doping process that would cause the pollution problem due to the diffused impurity is not necessary. The device efficiency is thus improved. Thus the deep trench contact structure can be disposed closer to the main device. Moreover, since the insulating oxide of the liner layer is formed on the sidewall of the deep trench contact structure, the deep trench contact structure can be used as an isolation structure for isolating devices and defining the active regions of the devices. Accordingly, the area for forming a single device can be decreased. Therefore, the number or density of devices that can be fabricated in a single wafer is increased.

The deep trench contact structure not deeper than the buried layer can provide a good isolated condition for a high-voltage device. The deep trench contact structure is easily formed since it is not influenced by aspect ratio controlling request. In addition, by choosing a doped polysilicon as the conductor of the deep trench contact structure, the stress caused from crystal lattice differences of the oxide of the liner layer and the epitaxial layer may be buffered, thus improving the stability and the efficiency of devices.

The buried layer can be electrically connected to an exterior through the deep trench contact structure. Therefore, the parasitic charge generated near the buried layer due to the high-voltage can be transferred to the exterior through the deep trench contact structure so as to prevent the noise signal. The voltage of the buried layer can be controlled from the exterior via the deep trench contact structure. Moreover, a doped region may be formed in the buried region under the deep trench contact structure. A dopant concentration of the doped region can be higher than that of the buried layer for obtaining a resistor/capacitor having a good interface and a stable conductor element. In addition, the buried layer can be formed with the first buried region having a higher dopant concentration and the second buried region having a lower dopant concentration. The first buried region can be wholly or partially embedded in the second buried region. Therefore, the second buried region can improve the operating voltage of the device while maintaining the perfect conductivity of the first buried region.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method of a semiconductor device, comprising:
   providing a substrate having a buried layer therein;
   forming a first deep trench contact structure in the substrate, wherein the first deep trench contact structure comprises a conductor and a liner layer on a sidewall of the conductor, and a bottom surface of the first deep trench contact structure is in contact with the buried layer, wherein a top portion of the substrate has an epitaxy layer above the buried layer, the first deep trench contact structure is formed in the epitaxy layer; and
   forming an isolation structure disposed in the epitaxy layer outside of the buried layer and first deep trench contact structure, such that the isolation structure directly contacts the buried layer and the first deep trench contact structure.

2. The fabrication method of a semiconductor device as claimed in claim 1, wherein the buried layer comprises a first buried region and a second buried region adjoined to the first buried region, wherein the first and second buried region have the same type of conductivity, and a carrier concentration of the first buried region is higher than a carrier concentration of the second buried region.

3. The fabrication method of a semiconductor device as claimed in claim 1, wherein the forming the first deep trench contact structure comprises:
   forming a first deep trench in the substrate, wherein the first deep trench exposes the buried layer;
   forming the liner layer on the sidewall of the first deep trench; and
   filling the first deep trench with the conductor.

4. The fabrication method of a semiconductor device as claimed in claim 1, further comprising forming a first doped region in the buried layer exposed by the first deep trench.

5. The fabrication method of a semiconductor device as claimed in claim 1, further comprising forming a well region adjoined to the first deep trench contact structure and buried layer.

6. The fabrication method of a semiconductor device as claimed in claim 1, wherein the forming the first deep trench contact structure comprises:
   forming a first deep trench in the epitaxy layer, wherein the first deep trench exposes the buried layer;
   forming the liner layer on the sidewall of the first deep trench; and filling the first deep trench with the conductor.

7. The fabrication method of a semiconductor device as claimed in claim 6, further comprising forming a first doped region in the buried layer exposed by the first deep trench.

8. The fabrication method of a semiconductor device as claimed in claim 1, further comprising forming a second deep trench contact structure in the epitaxy layer, wherein the second deep trench contact structure comprises the conductor and the liner layer on the sidewall of the conductor, and a bottom surface of the second deep trench contact structure is in contact with the substrate.

9. The fabrication method of a semiconductor device as claimed in claim 8, wherein the forming the second deep trench contact structure comprises:
   forming a second first deep trench in the epitaxy layer, wherein the second deep trench exposes the substrate;
   forming the liner layer on the sidewall of the second deep trench; and
   filling the second deep trench with the conductor.

10. The fabrication method of a semiconductor device as claimed in claim 9, further comprising forming a second doped region in the substrate exposed by the second deep trench.

* * * * *